(12) United States Patent
Lin et al.

(10) Patent No.: US 11,619,656 B2
(45) Date of Patent: Apr. 4, 2023

(54) PROBE HEAD AND DIE SET HAVING HORIZONTALLY FINE ADJUSTABLE DIE AND PROBE HEAD ADJUSTING METHOD

(71) Applicant: MPI CORPORATION, Chu-Pei (TW)

(72) Inventors: Chin-Yi Lin, Chu-Pei (TW); Keng-Min Su, Chu-Pei (TW); Che-Wei Lin, Chu-Pei (TW); Hsin-Cheng Hung, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 0 days.

(21) Appl. No.: 17/565,075

(22) Filed: Dec. 29, 2021

(65) Prior Publication Data

US 2022/0214379 A1 Jul. 7, 2022

Related U.S. Application Data

(60) Provisional application No. 63/134,735, filed on Jan. 7, 2021.

(30) Foreign Application Priority Data

Feb. 23, 2021 (TW) .................................. 110106326
Jun. 11, 2021 (TW) .................................. 110121506

(51) Int. Cl.
*G01R 1/073* (2006.01)
(52) U.S. Cl.
CPC ..... *G01R 1/07378* (2013.01); *G01R 1/07314* (2013.01); *G01R 1/07357* (2013.01)

(58) Field of Classification Search
CPC ............ G01R 1/07378; G01R 1/07314; G01R 1/07357
See application file for complete search history.

(56) References Cited

U.S. PATENT DOCUMENTS

2007/0170938 A1* 7/2007 Chen ..................... G01R 1/0466
  324/754.08
2015/0276800 A1* 10/2015 Chen .................. G01R 31/2891
  324/750.25

FOREIGN PATENT DOCUMENTS

TW     200829921 A    7/2008
TW     201823732 A    7/2018

* cited by examiner

*Primary Examiner* — Paresh Patel
(74) *Attorney, Agent, or Firm* — Birch, Stewart, Kolasch & Birch, LLP

(57) ABSTRACT

A probe head includes a middle die, upper and lower die units, at least one of which includes inner and outer dies detachably fastened to the middle die and each other, and a plurality of buckled probes inserted through the upper and lower die units. The inner die has an outer connecting surface connected with an inner surface of the outer die, where an installation recess is provided, an inner connecting surface connected with the middle die, and a probe installation section having a protruding portion protruding from the outer connecting surface and located in the installation recess, and a recessed portion recessed from the inner connecting surface and located correspondingly to the protruding portion. The protruding portion and the installation recess have a horizontal distance therebetween. Therefore, the outer die is horizontally fine adjustable to make the positions of the probes meet the requirement.

18 Claims, 14 Drawing Sheets

PROBE HEAD AND DIE SET HAVING HORIZONTALLY FINE ADJUSTABLE DIE AND PROBE HEAD ADJUSTING METHOD

CROSS REFERENCE TO RELATED APPLICATIONS

This non-provisional application claims the benefit under 35 U.S.C. § 119(e) to U.S. Provisional Application No. 63/134,735, filed on Jan. 7, 2021, and under 35 U.S.C. § 119(a) to patent application Ser. No. 11/010,6326, filed in Taiwan on Feb. 23, 2021 and patent application Ser. No. 11/012,1506, filed in Taiwan on Jun. 11, 2021, all of which are hereby expressly incorporated by reference into the present application.

BACKGROUND OF THE INVENTION

1. Field of the Invention

The present invention relates generally to probe heads of probe cards and more particularly, to a probe head and a die set, which have a horizontally fine adjustable die, and a probe head adjusting method.

2. Description of the Related Art

Referring to FIG. 1, a conventional probe head 10 of a probe card primarily includes a probe seat 11 and a plurality of probes 12. In practice the probe head includes hundreds or even thousands of probes, but only three probes are shown in FIG. 1 for concise illustrative purpose. The probe seat 11 usually includes a middle die 13, and upper and lower die units 14 and 15 disposed on top and bottom surfaces of the middle die 13 respectively. The probes 12 are inserted through the probe seat 11. The bottom end of each probe 12 protrudes below the lower die unit 15 for probing an electrically conductive contact of a device under test (not shown). The top end of each probe 12 protrudes above the upper die unit 14 to be abutted against an electrically conductive contact (not shown) provided on a bottom surface of a space transformer 19 disposed between a main circuit board 16 and the probe head 10. Alternatively, there may be no such space transformer 19, and the top end of each probe 12 is directly abutted against an electrically conductive contact provided on a bottom surface of the main circuit board 16.

Each of the upper and lower die units 14 and 15 usually includes an inner die 142 or 152 connected with the middle die 13, and an outer die 144 or 154 connected with the inner die 142 or 152. For each of the die units, the inner and outer dies are usually fastened to each other and fastened to the middle die 13 by bolts 17. Besides, the inner and outer dies 142, 152, 144 and 154 of the upper and lower die units 14 and 15 are each provided with a plurality of probe holes 18 with tiny size for the probes 12 to be inserted therethrough. When a position alignment problem happens, it may disable the probes 12 to be installed in the probe seat 11. Alternatively, after the installation of the probes 12 is accomplished, a flattening processing should be performed to the top and bottom ends of the probes. This step may cause the probes 12 partially slightly displaced, thereby causing the probes 12 abutted on the inner wall of the probe holes 18 at the positions not meeting the requirement.

SUMMARY OF THE INVENTION

The present invention has been accomplished in view of the above-noted circumstances. It is a primary objective of the present invention to provide a probe head including a die which can be horizontally fine adjusted after the installation of probes is accomplished, for making the positions of the probes meet the requirement.

To attain the above objective, the present invention provides a probe head which includes a middle die, upper and lower die units disposed on top and bottom surfaces of the middle die respectively, and a plurality of probes. At least one of the upper and lower die units is an adjustable die unit. The adjustable die unit includes an inner die and an outer die, which are detachably fastened to the middle die and detachably fastened to each other. The outer die has an inner surface, an outer surface, and an installation recess recessed from the inner surface. The inner die has an outer connecting surface connected with the inner surface of the outer die, an inner connecting surface connected with the middle die, and a probe installation section. The probe installation section has a protruding portion protruding from the outer connecting surface and located in the installation recess of the outer die, and a recessed portion recessed from the inner connecting surface and located correspondingly to the protruding portion. A horizontal distance is provided between the protruding portion and at least one inner side surface of the installation recess along a horizontal axis. The recessed portion and an accommodating hole penetrating through the top and bottom surfaces of the middle die collectively form a probe accommodating space. Each of the probes has a head portion inserted through the lower die unit, a tail portion inserted through the upper die unit, and a body portion located in the probe accommodating space. The head portion and the tail portion of each of the probes are offset from each other along the horizontal axis to make the body portion buckled in shape.

As a result, the adjustable die unit in the present invention is fastened to the middle die in a detachable fastening manner, and the inner and outer dies are also fastened to each other in a detachable fastening manner. Besides, the protruding portion of the inner die and the inner side surface of the installation recess of the outer die have the horizontal distance therebetween. Therefore, in the condition that the probes are partially located relative to the adjustable die unit at the positions not meeting the requirement, which may be resulted from the installation or flattening processing of the probes, such as the condition that the lower die unit is the adjustable die unit and the head portions of the probes are inserted through the through holes of the lower die unit and abutted on the inner walls thereof at the positions not meeting the requirement, the installer can firstly release the fixed relation between the inner and outer dies and then horizontally fine adjust the position of the outer die to make the positions of the probes meet the requirement.

For example, the outer die may have at least one first outer fastening hole and at least one second outer fastening hole, which penetrate through the inner surface and the outer surface of the outer die and located around the installation recess. The inner die may have at least one first inner fastening hole communicating with the first outer fastening hole and at least one second inner fastening hole communicating with the second outer fastening hole, which penetrate through the inner connecting surface and the outer connecting surface of the inner die and located around the probe installation section. The probe head may further include at least one first bolt inserted in the first inner fastening hole through the first outer fastening hole, and at least one second bolt inserted in the second outer fastening hole and the second inner fastening hole in a way that a position of the outer die is fine adjustable along the horizontal axis. The first bolt is detachably fixed to the middle die to fasten the inner die to the middle die. The second bolt is detachably fixed to the middle die to fasten the outer die to the inner die and the middle die. In such configuration, a probe head adjusting method of the present invention described below can be performed to make the positions of the probes meet the requirement. The probe head adjusting method includes the steps of:

loosening the second bolt disposed in the adjustable die unit;

adjusting the position of the outer die of the adjustable die unit along the horizontal axis; and tightening the second bolt disposed in the adjustable die unit.

The present invention further provides a die set, which includes a fixed unit, such as the aforementioned middle die, and an adjustable die unit including an inner die and an outer die. The inner and outer dies of the adjustable die unit have the aforementioned first and second inner fastening holes and first and second outer fastening holes, in which the aforementioned first and second bolts are disposed. Each of the first and second bolts includes a bolt head and a threaded rod. The bolt head of the first bolt is disposed in at least one of the first outer fastening hole and the first inner fastening hole and distanced from the inner wall thereof by an interval. Each part of the second bolt located in the second outer fastening hole is distanced from the inner wall of the second outer fastening hole by an interval. Therefore, the outer die can be horizontally fine adjusted as described above.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
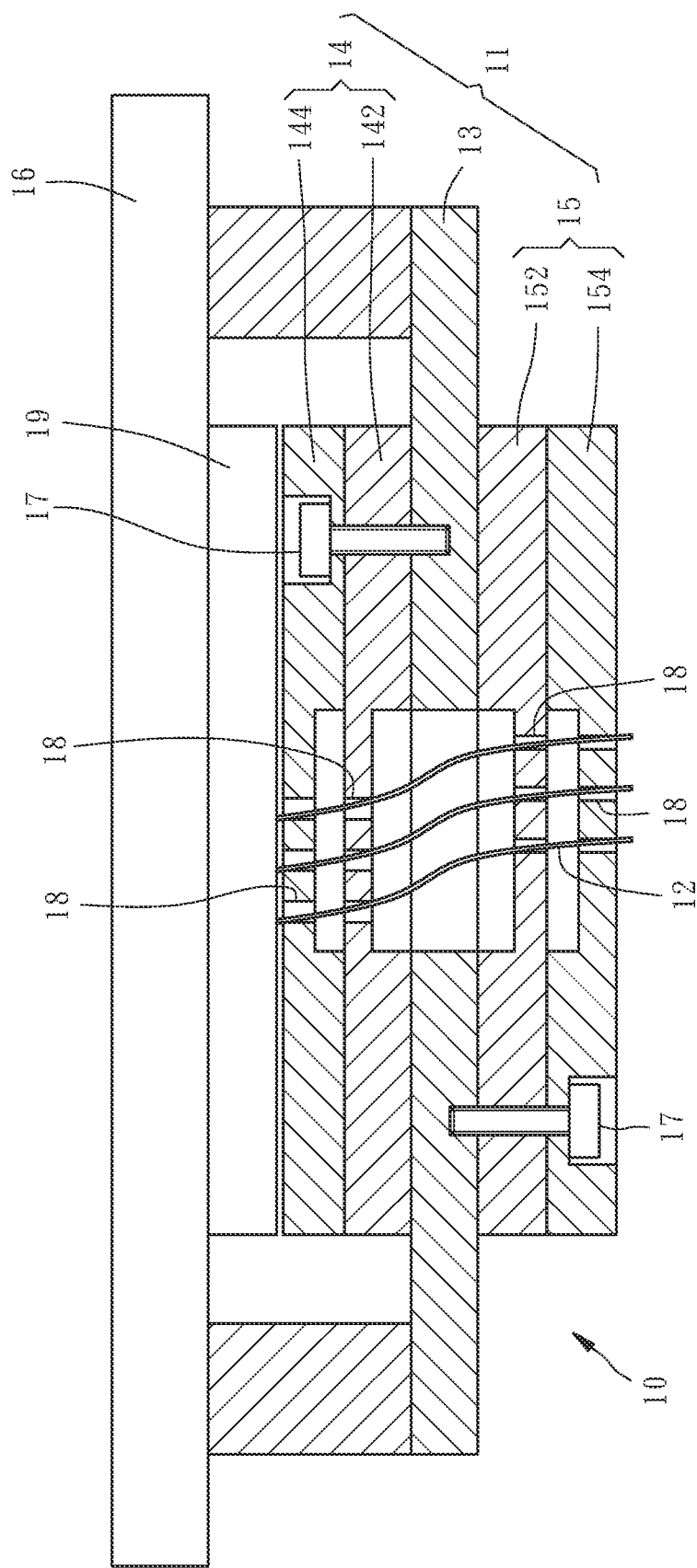
FIG. 1 is a schematic sectional view of a probe head, a main circuit board and a space transformer of a conventional probe card.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice.

Figure 2:
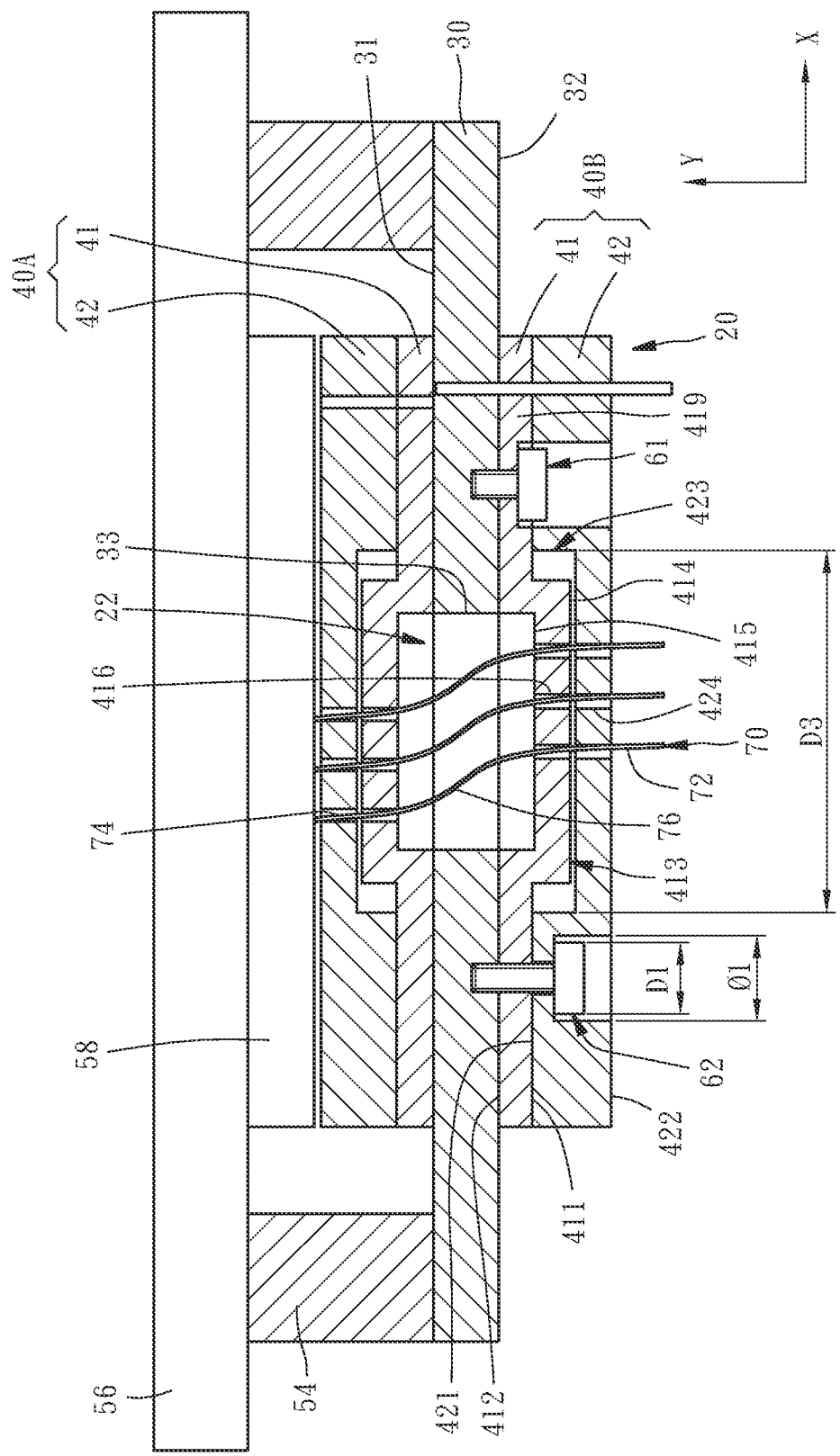
FIG. 2 is a schematic sectional view of a main circuit board, a space transformer, and a probe head having horizontally fine adjustable dies according to a first preferred embodiment of the present invention.

Referring to FIG. 2, a probe head 20 according to a first preferred embodiment of the present invention primarily includes a middle die 30, an upper die unit 40A, a lower die unit 40B, a plurality of first bolts 61, a plurality of second bolts 62, and a plurality of probes 70.

Figure 3:
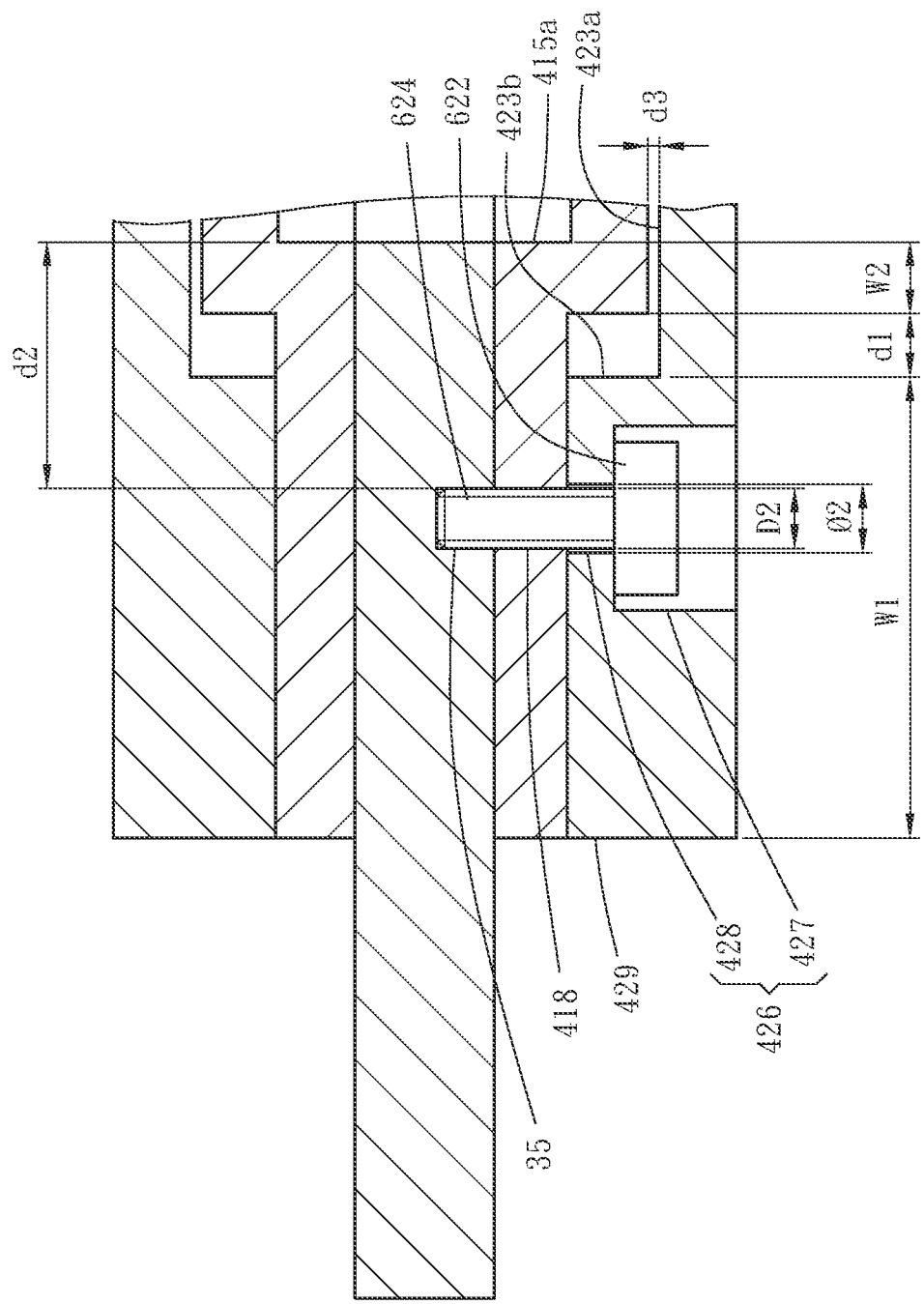
FIG. 3 and FIG. 4 are partially enlarged views of the probe head as shown in FIG. 2.
Figure 4:
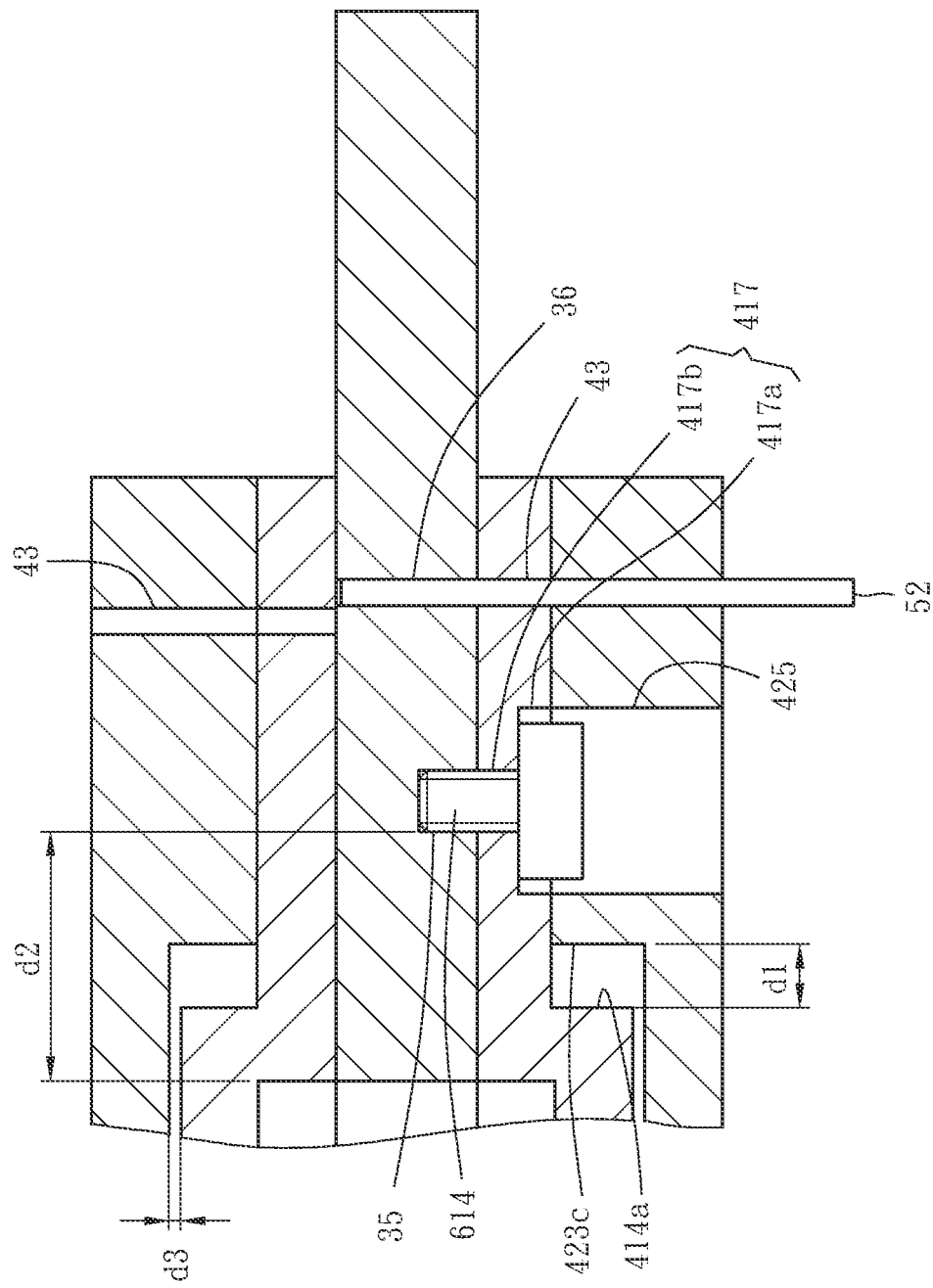
Figure 5:
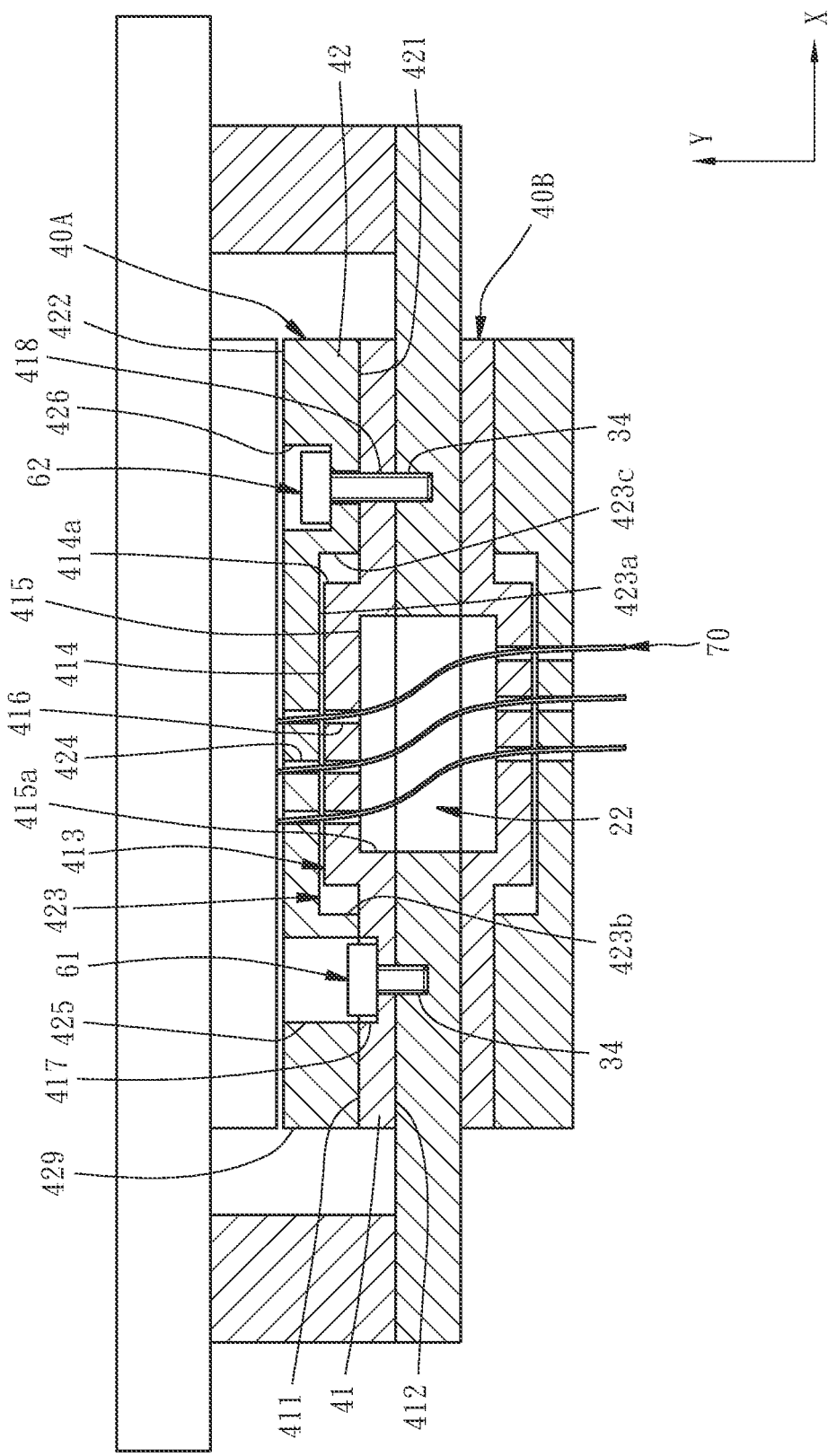
FIG. 5 is another schematic sectional view of the probe head, the main circuit board and the space transformer.
Figure 6:
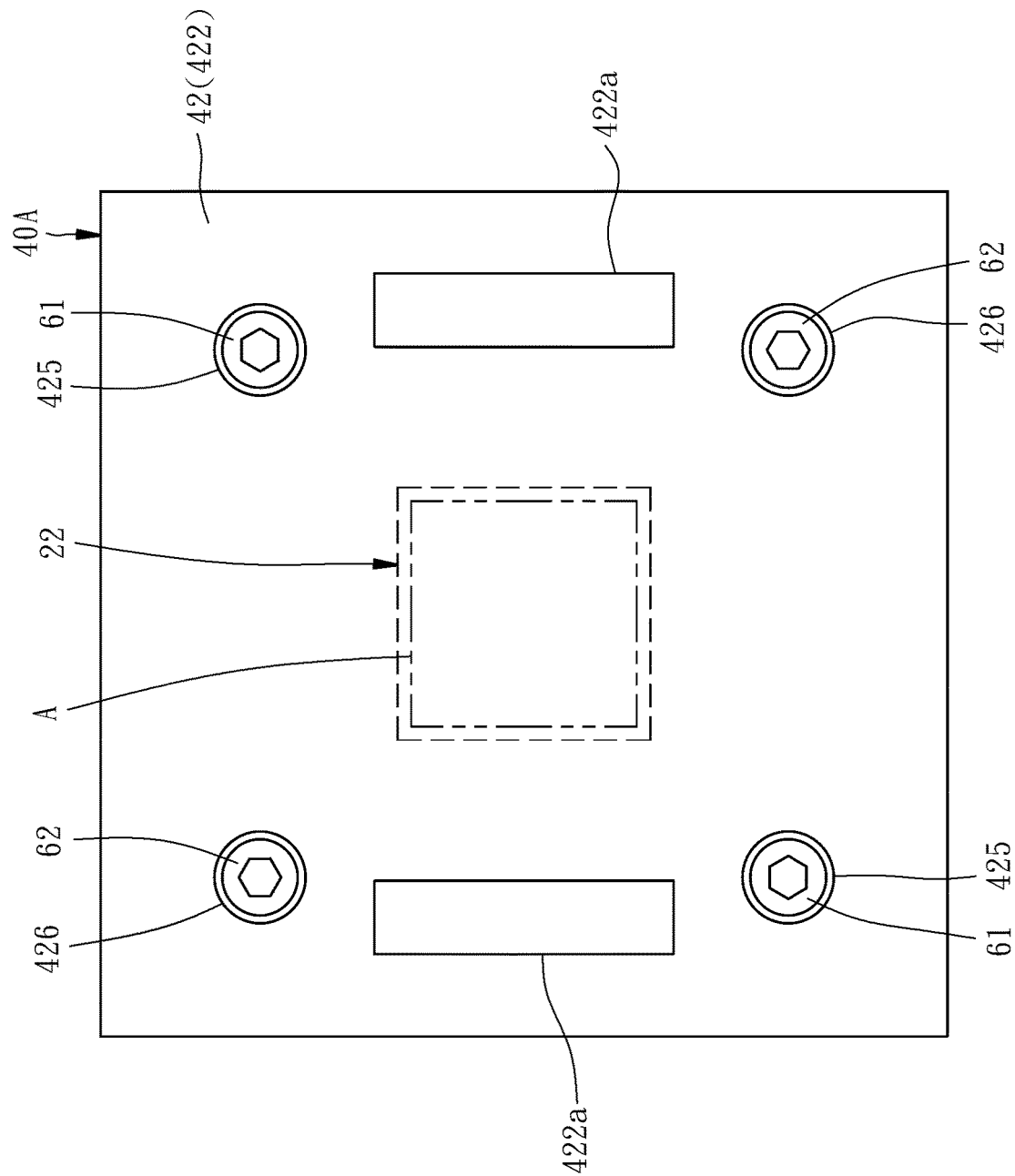
FIG. 6 is a schematic top view of an upper die unit and a plurality of first and second bolts of the probe head, but not showing probe holes.
Figure 7:
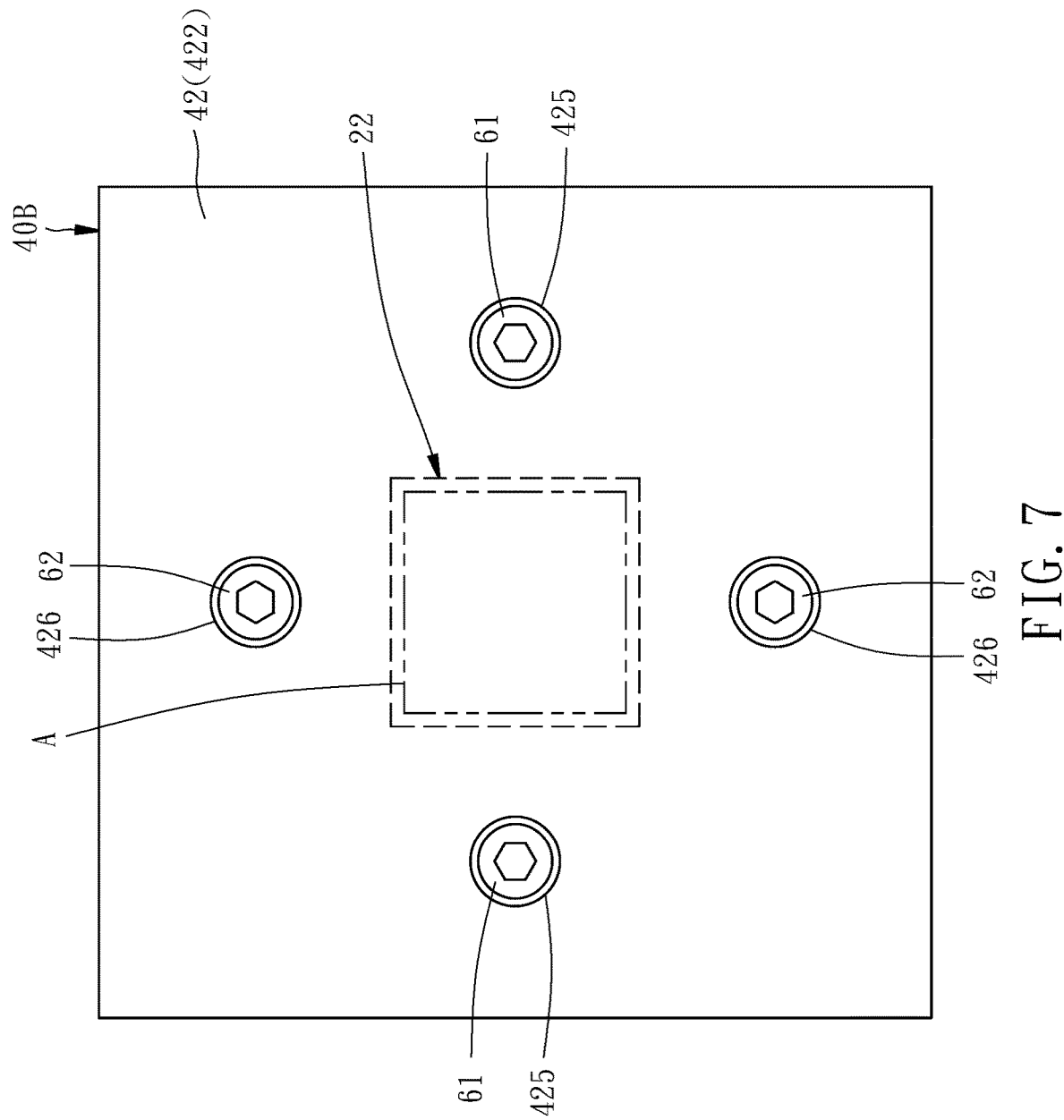
FIG. 7 is a schematic bottom view of a lower die unit and a plurality of first and second bolts of the probe head, but not showing probe holes.
Figure 8:
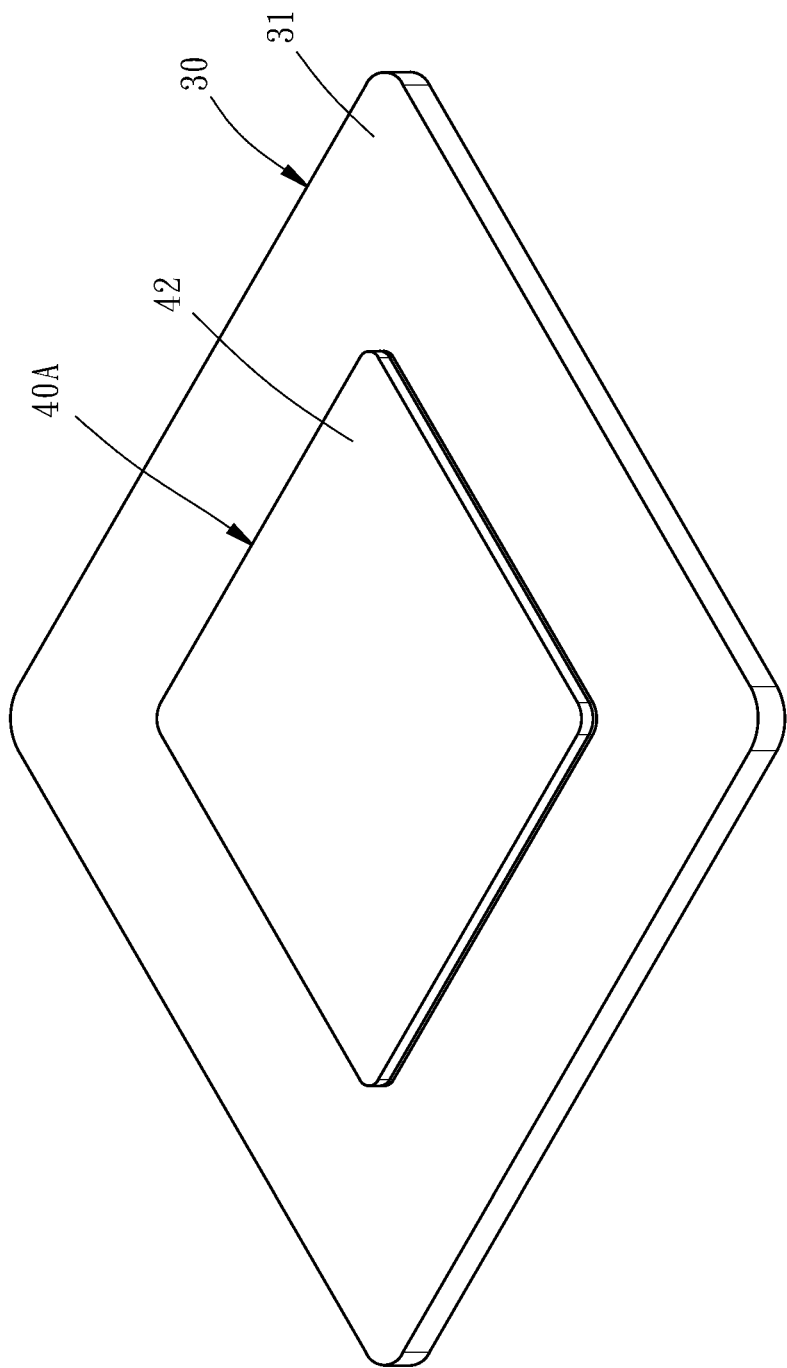
FIG. 8 is an assembled perspective view of the upper and lower die units and a middle die of the probe head, but not showing probe holes and fastening holes.
Figure 9:
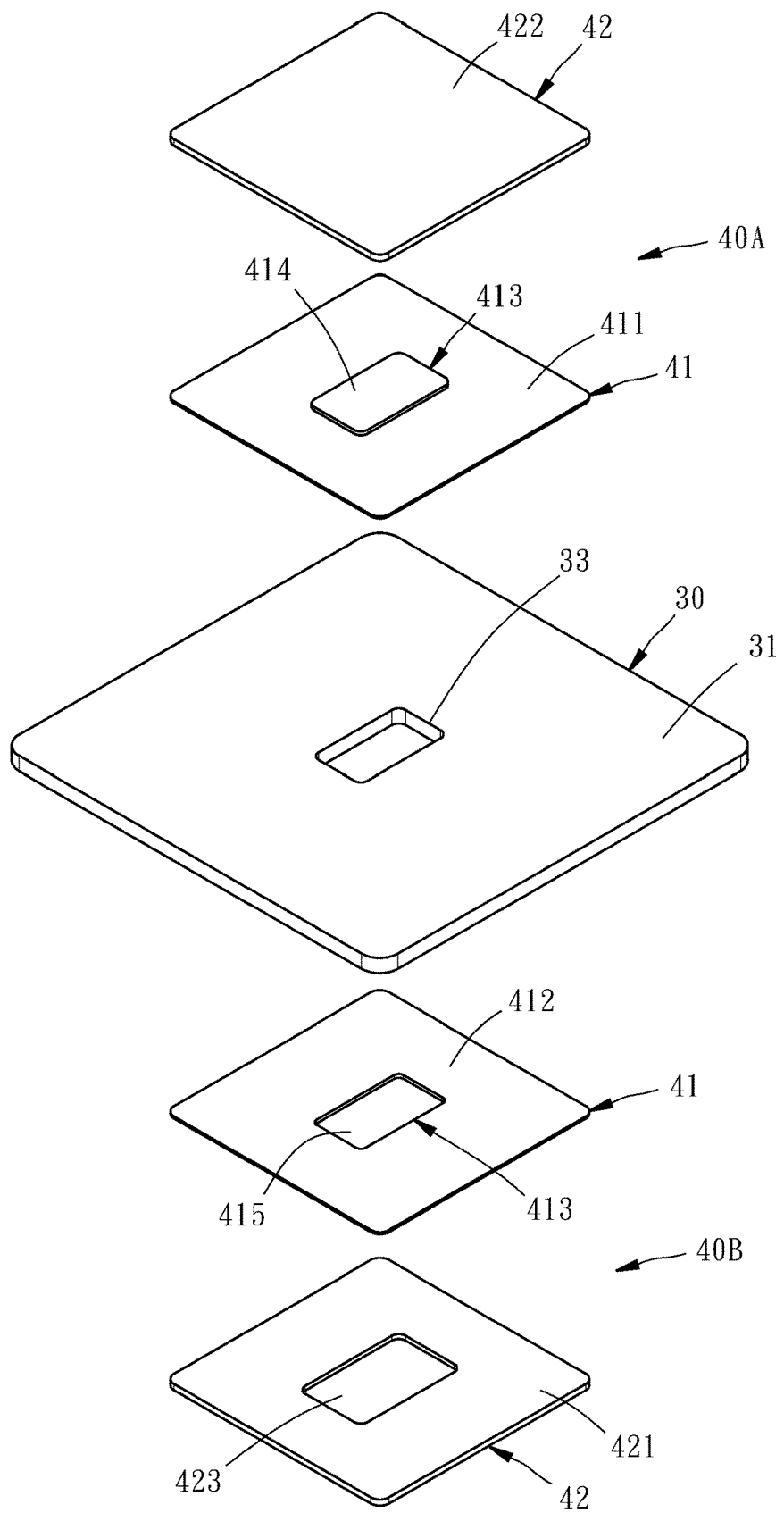
FIG. 9 and FIG. 10 are schematically exploded perspective views of the upper and lower die units and the middle die of the probe head, but not showing probe holes and fastening holes.
Figure 10:
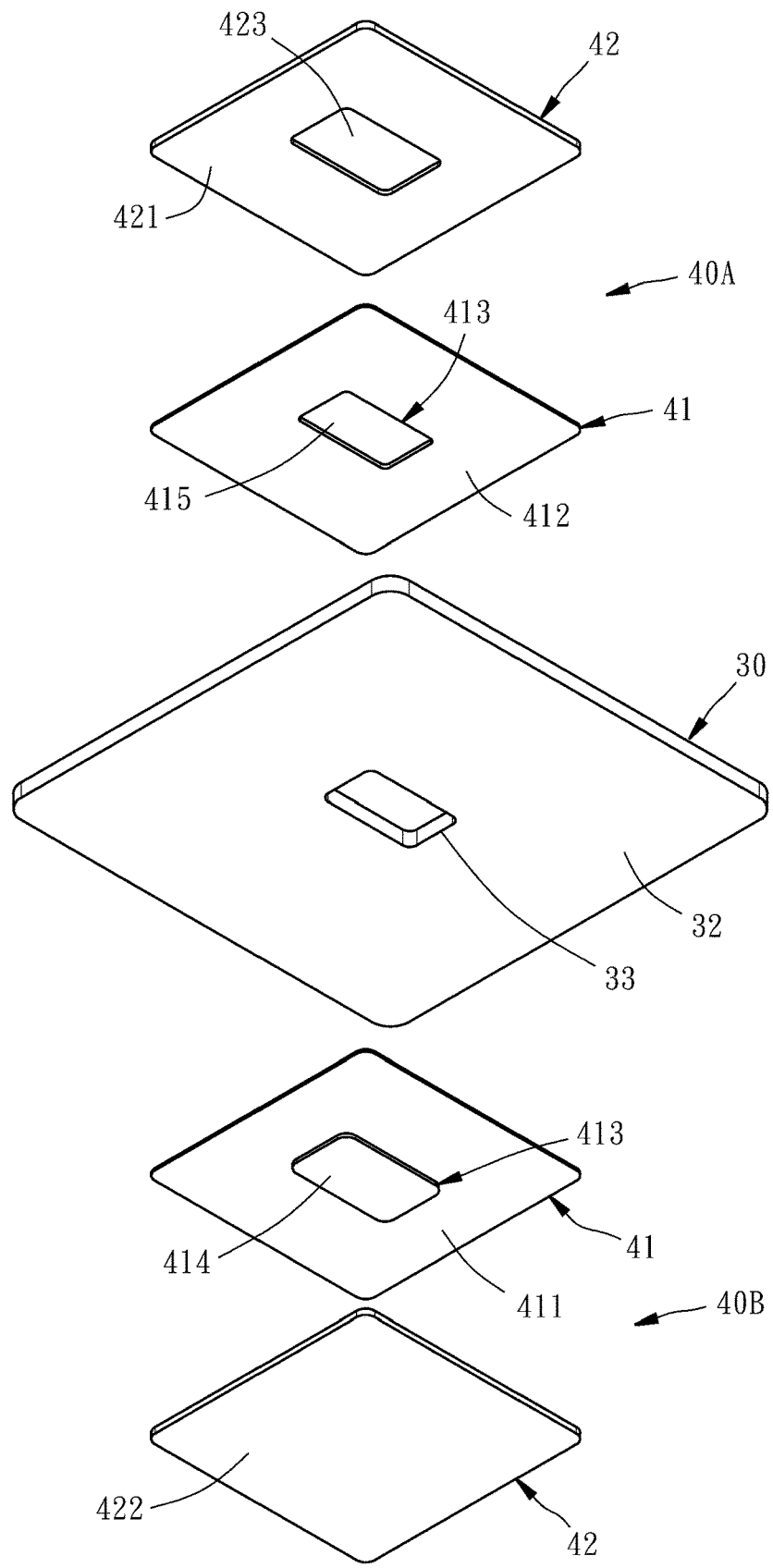

It should be firstly mentioned here that the structure of the present invention is primarily shown by the sectional views in FIG. 2 to FIG. 5, and the planar views in FIG. 6 and FIG. 7 are auxiliary to illustrate the relative position between the upper and lower die units 40A and 40B and the first and second bolts 61 and 62. For the simplification of the figures and the concise illustration, the tiny holes of the upper and lower die units 40A and 40B, through which the probes 70 are to be inserted, i.e. the inner and outer probe holes going to be detailedly specified in the following, are not shown in FIG. 6 and FIG. 7. Besides, the perspective views in FIG. 8 to FIG. 10 are primarily provided for more clearly showing the appearance shapes of the middle die 30 and the upper and lower die units 40A and 40B, not showing the tiny holes for the probes 70 to be inserted therethrough and fastening holes for the first and second bolts 61 and 62 to be inserted therethrough, i.e. the first and second inner and outer fastening holes going to be specified in the following. Furthermore, for the simplification of the figures and concise illustration, a first bolt 61, a second bolt 62, and their associated fastening holes are schematically shown in FIG. 2 to FIG. 4, another first bolt 61, another second bolt 62, and their associated fastening holes are schematically shown in FIG. 5, and the first and second bolts 61 and 62 and fastening holes shown in FIG. 2 to FIG. 5 don't correspond in position to the first and second bolts 61 and 62 and fastening holes shown in FIG. 6 and FIG. 7.

As shown in FIG. 8 to FIG. 10, the middle die 30 in this embodiment is shaped as a rectangle, which is provided at the center thereof with a rectangular accommodating hole 33 penetrating through the top surface 31 and bottom surface 32 of the middle die 30. Besides, as shown in FIG. 2 to FIG. 5, the top surface 31 of the middle die 30 has a plurality of top threaded holes 34 located around the accommodating hole 33, and the bottom surface 32 of the middle die 30 has a plurality of bottom threaded holes 35 located around the accommodating hole 33.

As shown in FIG. 8 to FIG. 10, each of the upper and lower die units 40A and 40B in this embodiment includes an inner die 41 and an outer die 42. Each of the inner and outer dies 41 and 42 is shaped as a rectangle and sized smaller than the middle die 30. Each of the inner dies 41 has an outer connecting surface 411, an inner connecting surface 412, and a probe installation section 413. The probe installation section 413 has a rectangular protruding portion 414 protruding from the outer connecting surface 411, and a rectangular recessed portion 415 recessed form the inner connecting surface 412. The recessed portion 415 is located correspondingly to the protruding portion 414 and sized smaller than the protruding portion 414. Each of the outer dies 42 has an inner surface 421, an outer surface 422, and a rectangular installation recess 423 recessed from the inner surface 421. As shown in FIG. 2 and FIG. 5, the inner connecting surfaces 412 of the inner dies 41 of the upper and lower die units 40A and 40B are connected with the top and bottom surfaces 31 and 32 of the middle die 30 respectively, the inner surfaces 421 of the outer dies 42 of the upper and lower die units 40A and 40B are connected with the outer connecting surfaces 411 of the inner dies 41, and the protruding portions 414 of the inner dies 41 are located in the installation recesses 423 of the outer dies 42.

Besides, the inner die 41 of each of the upper and lower die units 40A and 40B further has a plurality of inner probe holes 416 located in the recessed portion 415 and penetrating through the protruding portion 414, and at least one first inner fastening hole 417 as shown in FIG. 4 and at least one second inner fastening hole 418 as shown in FIG. 3, which penetrate through the inner and outer connecting surfaces 412 and 411 and located around the probe installation section 413. In this embodiment, the first inner fastening hole 417 is a counterbore having large and small radius portions, and the second inner fastening hole 418 is a normal through hole uniform in radius. Likewise, the outer die 42 of each of the upper and lower die units 40A and 40B has a plurality of outer probe holes 424 communicating with the inner probe holes 416 respectively, at least one first outer fastening hole 425 (as shown in FIG. 4) communicating with the first inner fastening hole 417, and at least one second outer fastening hole 426 (as shown in FIG. 3) communicating with the second inner fastening hole 418. Each of the outer probe holes 424 penetrates through the outer surface 422 of the outer die 42 and an inner bottom surface 423a of the installation recess 423. The first and second outer fastening holes 425 and 426 penetrate through the inner and outer surfaces 421 and 422 of the outer die 42 and are located around the installation recess 423. In this embodiment, the first outer fastening hole 425 is a normal through hole having uniform radius, and the second outer fastening hole 426 is a counterbore having large and small radius portions. For example, the counterbore mentioned in the present invention is like the second outer fastening hole 426 as shown in FIG. 3, which has a large radius portion 427 with relatively larger inner radius and a small radius portion 428 with relatively smaller inner radius, such that the bolt head 622 and threaded rod 624 of the second bolt as shown in FIG. 3 can be disposed in the large radius portion 427 and small radius portion 428, respectively.

As shown in FIG. 6 and FIG. 7, the outer die 42 of each of the upper and lower die units 40A and 40B may be provided with two first outer fastening holes 425 and two second outer fastening holes 426 arranged in a staggered manner, which means the inner die 41 of each of the upper and lower die units 40A and 40B is also correspondingly provided with two first inner fastening holes 417 and two second inner fastening holes 418. In the same die unit, the inner and outer fastening holes 425, 426, 417 and 418 are distanced from the center of the probe head 20 equally, which means they are located on the same imaginary circle with respect to the center of the probe head. The positions of the fastening holes of the upper and lower die units 40A and 40B may be arranged in a staggered manner. For example, in FIG. 6 the first and second outer fastening holes 425 and 426 of the upper die unit 40A are located correspondingly to four corners of the outer die 42, and in FIG. 7 the first and second outer fastening holes 425 and 426 of the lower die unit 40B are located correspondingly to four sides of the outer die 42.

Each of the upper and lower die units 40A and 40B and the middle die 30 further has a probe installation positioning hole 43 or 36 as shown in FIG. 4. When the probes 70 have not been installed yet, the relative position of the upper and lower die units 40A and 40B is not arranged as shown in FIG. 2, but arranged in a way that the probe installation positioning holes 43 and 36 communicate and align with each other. At this time, a positioning pin 52 as shown in FIG. 4 is inserted through the probe installation positioning holes 43 and 36. The inner and outer probe holes 416 and 424 of the upper die unit 40A are coaxially aligned with the inner and outer probe holes 416 and 424 of the lower die unit 40B. Each probe 70 is shaped as a straight line and inserted through the coaxially-aligned inner and outer probe holes 416 and 424 of the upper and lower die units 40A and 40B downwardly along a vertical axis (Y-axis). After the installation of all probes 70 is accomplished, the positioning pin 52 is taken out from the probe installation positioning holes 43 and 36. Then, the upper and lower die units 40A and 40B are displaced relative to each other along a horizontal axis (X-axis). For example, in this embodiment the upper die unit 40A is moved in the negative direction of X-axis to the position as shown in FIG. 2, so that the probe installation positioning hole 43 of the upper die unit 40A is offset from the probe installation positioning holes 36 and 43 of the middle die 30 and lower die unit 40B, and the recessed portions 415 of the inner dies 41 of the upper and lower die units 40A and 40B are located correspondingly to each other. The recessed portions 415 and the accommodating hole 33 of the middle die 30 collectively form a probe accommodating space 22. At this time, as shown in FIG. 2, each of the probes 70 is defined with a head portion 72 inserted through the lower die unit 40B, a tail portion 74 inserted through the upper die unit 40A, and a body portion 76 located in the probe accommodating space 22. The head portion 72 and tail portion 74 of each of the probes 70 are offset from each other along the horizontal axis (X-axis) to make the body portion 76 buckled in shape. Besides, for each of the upper and lower die units 40A and 40B, a horizontal distance d1 is provided between the protruding portion 414 of the inner die 41 and two inner side surfaces 423b and 423c of the installation recess 423 of the outer die 42 along the horizontal axis (X-axis).

In the above-described assembling manner of moving the upper die unit 40A along the horizontal axis (X-axis) to achieve the offset effect, the lower die unit 40B can be fastened to the middle die 30 by the first and second bolts 61 and 62 before the probe installation. As shown in FIG. 2 to FIG. 4, the first bolt 61 is inserted in the first inner fastening hole 417 through the first outer fastening hole 425 and screwed into the bottom threaded hole 35 of the middle die 30 to fasten the inner die 41 of the lower die unit 40B to the middle die 30. The second bolt 62 is inserted in the second outer fastening hole 426 and the second inner fastening hole 418 and screwed into the bottom threaded hole 35 of the middle die 30 to fasten the outer die 42 of the lower die unit 40B to the inner die 41 and the middle die 30. After the above-described probe installation and offset step are accomplished, the upper die unit 40A is fastened to the middle die 30 by the first and second bolts 61 and 62. As shown in FIG. 5, the first bolt 61 is inserted in the first inner fastening hole 417 through the first outer fastening hole 425 and screwed into the top threaded hole 34 of the middle die 30 to fasten the inner die 41 of the upper die unit 40A to the middle die 30. The second bolt 62 is inserted in the second outer fastening hole 426 and the second inner fastening hole 418 and screwed into the top threaded hole 34 of the middle die 30 to fasten the outer die 42 of the upper die unit 40A to the inner die 41 and the middle die 30. After that, a flattening processing will be performed to the bottom end of the head portion 72 and the top end of the tail portion 74 of each probe 70. If there is no such problem that the probes 70 partially displace, the assembly of the probe head 20 is accomplished. As shown in FIG. 2, the middle die 30 is fastened to a main circuit board 56 by one or a plurality of fastening members 54 disposed close to the periphery of the middle die 30. The top end of the tail portion 74 of each probe 70 is abutted against an electrically conductive contact of a space transformer 58, such that the probe head 20, the main circuit board 56 and the space transformer 58 are constructed to form a probe card. By the above-described structure, the upper and lower die units 40A and 40B of the probe head 20 in this embodiment are both adjustable die units. The inner and outer dies 41 and 42 of the same adjustable die unit are detachably fastened to each other and detachably fastened to the middle die 30. When the second bolts 62 have not been tightened yet, the position of the outer die 42 can be fine adjusted relative to the inner die 41 horizontally, such as along the horizontal axis (X-axis). Therefore, if the probe installation or flattening processing causes the probes 70 partially displaced and thereby makes the positions of the probes 70 relative to the adjustable die unit not meet the requirement, a probe head adjusting method can be used to perform fine adjustment. The probe head adjusting method includes the following steps.

a) Loosen the second bolts 62 disposed in the adjustable die unit. For example, if the head portions 72 of the probes 70 are abutted on the inner walls of the outer probe holes 424 of the lower die unit 40B at the positions not meeting the requirement, the installer can firstly loosen the second bolts 62 disposed in the lower die unit 40B to release the fixed relation between the inner and outer dies 41 and 42 of the lower die unit 40B.

b) Adjust the position of the outer die 42 of the adjustable die unit along the horizontal axis (X-axis). As described above, the protruding portion 414 of the inner die 41 and the installation recess 423 of the outer die 42 have the horizontal distance d1 therebetween. Besides, as shown in FIG. 2 and FIG. 3, the diameter Ø1 of the large radius portion 427 of the second outer fastening hole 426 is a little larger than the diameter D1 of the bolt head 622 of the second bolt 62, and the diameter Ø2 of the small radius portion 428 of the second outer fastening hole 426 is a little larger than the diameter D2 of the threaded rod 624 of the second bolt 62. Therefore, continuing the above-described example, when the outer die 42 of the lower die unit 40B is not fastened by the second bolts 62, the position of the outer die 42 can be fine adjusted along the horizontal axis (X-axis) to make the head portions 72 of the probes 70 abutted on the inner walls of the outer probe holes 424 of the lower die unit 40B at the positions meeting the requirement.

c) Tighten the second bolts 62 disposed in the adjustable die unit to fasten the inner and outer dies 41 and 42 to each other.

Figure 11:
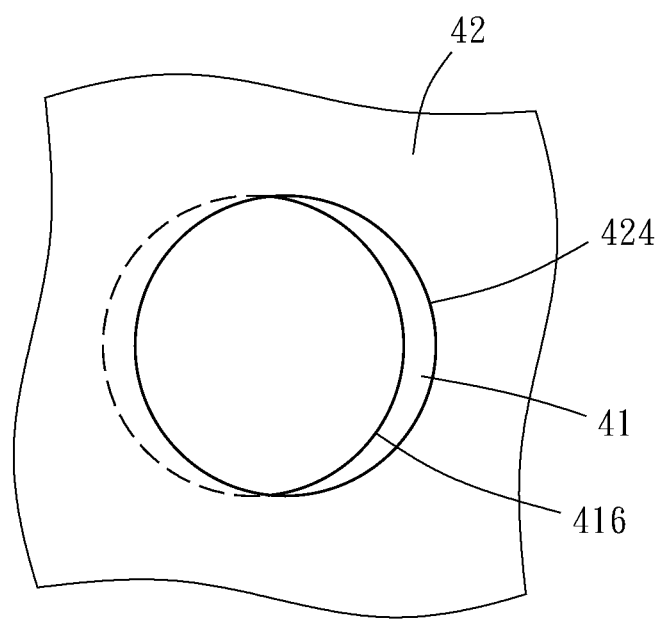
FIG. 11 is a schematic view of a part of the probe head.

It can be known from the above description that according to different usage requirements, it may need to adjust the position of only the head portion 72 or tail portion 74 of the probe 70 relative to the outer probe hole 424 of the outer die 42, or the head portion 72 and the tail portion 74 may both need the adjustment. Therefore, in the probe head 20 of the present invention, the upper and lower die units 40A and 40B may be both the aforementioned adjustable die units, or only one of the upper and lower die units 40A and 40B is the adjustable die unit. Through the outer probe holes 424 or the probe installation positioning holes 43 of the present invention, whether the outer die 42 of the adjustable die unit has been horizontally fine adjusted can be observed by the user. For example, FIG. 11 shows a condition of observing through the outer probe hole 424 toward the inner die 41, wherein it can be seen that a shadow produced by the partial inner wall of the inner probe hole 416 is located at the right side of the outer probe hole 424. If it can be observed that the outer probe holes 424 mostly have such shadow in the same direction, it means not only single one outer probe hole 424 has the positioning problem, but the outer die 42 has been fine adjusted to the right so that the outer probe holes 424 are displaced to the right synchronously.

By the configuration design of the present invention that the inner die 41 has the protruding portion 414 and the recessed portion 415 and thereby shaped like a hat and the outer die 42 has the installation recess 423 accommodating the protruding portion 414, the outer die 42 can be provided with a small span D3, i.e. the width of the installation recess 423 along X-axis, and the outer die 42 can be provided with a large outer wall thickness W1. As shown in FIG. 3, the outer wall thickness W1 is defined as the distance between the outer peripheral surface 429 of the outer die 42 and the inner side surfaces 423b and 423c of the installation recess 423 along the horizontal axis. The outer dies 42 of the upper and lower die units 40A and 40B having the small span or large outer wall thickness W1 bring the probe head 20 relatively higher structural strength. Besides, in the condition that the outer surface 422 of the upper die unit 40A is provided with an accommodating trough 422a as shown in FIG. 6, which may be a recess or a through hole, for accommodating a component (not shown) disposed on the bottom surface of the space transformer 58 located above the upper die unit, the upper die unit 40A having the large outer wall thickness W1 brings the accommodating trough 422a a relatively better opportunity of being provided at the relatively thicker part of the outer die 42 of the upper die unit 40A, i.e. the part not located correspondingly to or aimed at the installation recess 423. Besides, the outer dies 42 of the upper and lower die units 40A and 40B having the small span or large outer wall thickness W1 also enable the first and second bolts 61 and 62 to be located further close to the probe accommodating space 22 and enlarge the screwing scope so as to raise the firmness of the probe head 20. Specifically speaking, a fastening distance d2 is provided between the threaded rod 614 or 624 of each of the first and second bolts 61 and 62 and the probe accommodating space 22 along the horizontal axis. The fastening distance d2 is larger than the sum of the horizontal distance d1 and an inner wall thickness W2 of the inner die 41. As shown in FIG. 3 and FIG. 4, the inner wall thickness W2 is defined as the distance between the outer peripheral surface 414a of the protruding portion 414 of the inner die 41 and the inner peripheral surface 415a of the recessed portion 415 along the horizontal axis. As described above, in this embodiment the inner and outer fastening holes 425, 426 417 and 418 of the same adjustable die unit are distanced from the center of the probe head 20 equally. Therefore, the threaded rods 614 and 624 of the first and second bolts 61 and 62 inserted in the same adjustable die unit are equal in fastening distance d2 from the probe accommodating space 22, but the present invention is unlimited thereto. The first and second bolts 61 and 62 disposed in the same adjustable die unit may be unequal in fastening distance d2, which can be modified according to the practical configuration requirement.

It is to be mentioned that on the premise that the inner and outer dies 41 and 42 have the aforementioned horizontal distance d1 for the adjustment, if the inner die 41 only has the recessed portion 415 but has no such protruding portion 414, which means the inner die 41 doesn't have an extending portion 419 extending outward from the probe installation section 413 and shaped like the brim of the hat as shown in FIG. 2, the inner die 41 has no such extending portion 419 for being disposed between the relatively thicker part of the outer die 42 and the middle die 30 and fastened by the first and second bolts 61 and 62. In such condition, the inner die 41 should be configured with relatively larger inner wall thickness W2 for being fastened by the bolts, and thereby the outer die 42 should be correspondingly configured with relatively larger span D3. Therefore, in the present invention, the configuration design that the inner die 41 has the protruding portion 414 and the recessed portion 415 brings relatively higher structural strength on the premise that the outer die 42 can be horizontally fine adjusted.

Based on the requirement of horizontally adjusting the outer die 42 in the step b) of the aforementioned probe head adjusting method, the horizontal distance d1 between the protruding portion 414 of the inner die 41 and the installation recess 423 of the outer die 42 is preferably larger than or equal to 0.05 millimeters (mm) and smaller than or equal to 2 millimeters. If the horizontal distance d1 is smaller than 0.05 millimeters, the range for fine adjusting the outer die 42 may be insufficient. If the horizontal distance d1 is larger than 2 millimeters, the span of the outer die 42 may be too large and the outer wall thickness W1 may be too small. Based on the configuration requirement that the outer die 42 has small span and large outer wall thickness W1, the inner wall thickness W2 of the inner die 41 can be only larger than 0.1 millimeters. The outer wall thickness W1 is larger than the inner wall thickness W2. Besides, in order to provide the inner and outer dies 41 and 42 tolerance space for machining accuracy and make them easy to be assembled with each other, a vertical distance d3 may be provided between the protruding portion 414 of the inner die 41 and the inner bottom surface 423a of the installation recess 423 of the outer die 42 along the vertical axis (Y-axis). The vertical distance d3 is preferably larger than or equal to 0 millimeter and smaller than or equal to 2 millimeters. If the vertical distance d3 is larger than 2 millimeters, the outer die 42 may have relatively lower structural strength.

In conclusion, in the probe head 20 of the present invention, at least one of the upper and lower die units 40A and 40B is an adjustable die unit whose outer die is horizontally fine adjustable, and the inner and outer dies 41 and 42 are fastened to the middle die 30 in a detachable fastening manner and also fastened to each other in a detachable fastening manner, thereby raising the flexibility of die adjustment for making the positions of the probes meet the requirement. Besides, the outer die 42 has small span and large outer wall thickness W1, resulting in high structural strength and more available thicker part for being provided with the accommodating trough 422a for accommodating a component. If only the upper die unit 40A is the adjustable die unit whose outer die is horizontally fine adjustable, the lower die unit 40B and the middle die 30 may be manufactured integrally. On the contrary, if only the lower die unit 40B is the adjustable die unit whose outer die is horizontally fine adjustable, the upper die unit 40A and the middle die 30 may be manufactured integrally.

Figure 12:
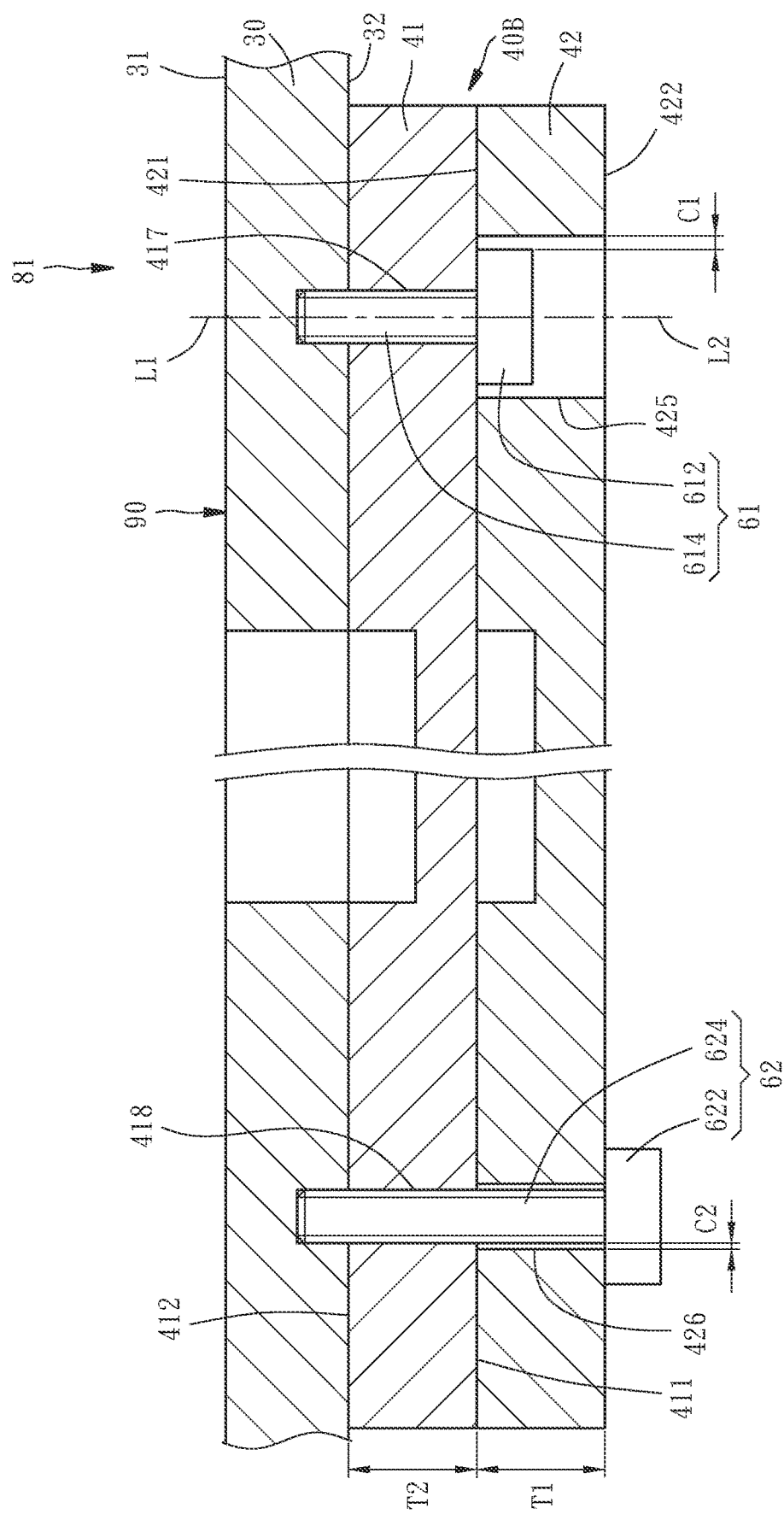
FIG. 12 is a schematic sectional view of a die set according to a second preferred embodiment of the present invention.
Figure 13:
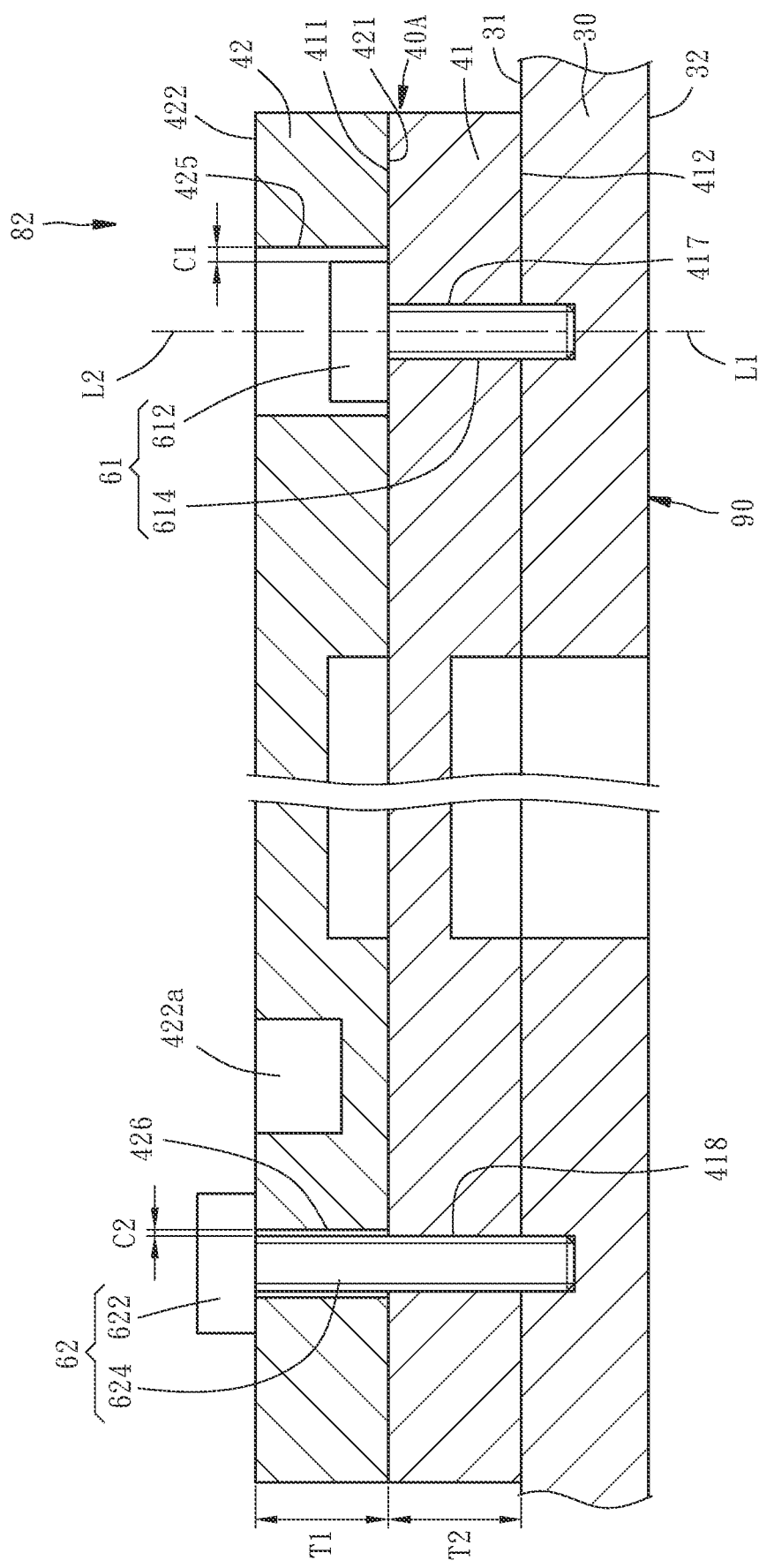
FIG. 13 is a schematic sectional view of a die set according to a third preferred embodiment of the present invention.

As described above, the present invention has the configuration design that the inner die 41 has the protruding portion 414 and the recessed portion 415 and thereby shaped like a hat and the outer die 42 has the installation recess 423 accommodating the protruding portion 414, which benefits the overall structure of the probe head 20. However, the feature of the present invention that the outer die 42 of the adjustable die unit is horizontally fine adjustable is unlimited to be achieved by the aforementioned hat-shaped structure. Besides, as described above, in the present invention it may be only one of the upper and lower die units 40A and 40B the adjustable die unit. Therefore, the second and third preferred embodiments of the present invention provides die sets 81 and 82 respectively, as shown in FIG. 12 and FIG. 13. Each of the die sets 81 and 82 includes a fixed unit 90, an adjustable die unit and first and second bolts 61 and 62, wherein the adjustable die unit 40B of the die set 81 is similar to the lower die unit 40B in the aforementioned first preferred embodiment, the adjustable die unit 40A of the die set 82 is similar to the upper die unit 40A in the aforementioned first preferred embodiment, but the adjustable die units 40B and 40A of the die sets 81 and 82 have no such hat-shaped structure as being disclosed in the aforementioned first preferred embodiment. The thickness T1 of the outer die 42 defined on the outer periphery of the die set is larger than or equal to the thickness T2 of the inner die 41 defined on the outer periphery of the die set. Besides, the fastening manner of the bolts is also different, which will be specified in the following.

Each of the first bolts 61 and second bolts 62 includes a bolt head 612 or 622 and a threaded rod 614 or 624. In FIG. 12 and FIG. 13, the bolt head 612 of the first bolt 61 is disposed in the first outer fastening hole 425, and the periphery of the bolt head 612 of the first bolt 61 is distanced from the inner wall of the first outer fastening hole 425 by an interval C1. The threaded rod 614 of the first bolt 61 is screwed into the inner die 41 and the fixed unit. It should be mentioned here that in the embodiments as shown in FIG. 12 and FIG. 13, the fixed unit 90 includes only the above-described middle die 30, and the threaded rod 614 of the first bolt 61 is screwed into the middle die 30. However, as described above, one side of the middle die 30 is connected with the adjustable die unit, and the other side of the middle die 30 is connected with another adjustable or non-adjustable die unit. Therefore, the threaded rod 614 of the first bolt 61 is unlimited to be screwed into the middle die 30, which means the fixed unit 90 is unlimited to include only the middle die 30. For example, in FIG. 13 the adjustable die unit 40A is the upper die unit disposed on the top surface 31 of the middle die 30, and there may be a lower die unit disposed on the bottom surface 32 of the middle die 30. The lower die unit may be also an adjustable die unit, or a non-adjustable die unit which includes a single die or a plurality of dies. In such a case, the threaded rod 614 of the first bolt 61 may be screwed into the middle die 30, or may be inserted through the middle die 30 to be screwed into the aforementioned single die or one of the plurality of dies of the lower die unit. Alternatively, there may be no such middle die 30 disposed between the upper and lower die units, or the middle die and the lower die unit may be formed integrally. In such a case, the inner die 41 of the adjustable die unit 40A is directly fastened to the lower die unit by the first bolts 61, which means the threaded rod 614 of the first bolt 61 is screwed into the lower die unit. In other words, the fixed unit 90 may include only the middle die 30, or may include the middle die 30 and the entirety or partial dies of another die unit, or may include only the entirety or partial dies of the aforementioned another die unit but include no such middle die.

Besides, the bolt head 622 of the second bolt 62 is disposed on the outer surface 422 of the outer die 42, the threaded rod 624 of the second bolt 62 is inserted through the second outer fastening hole 426 and screwed into the inner die 41 and the fixed unit 90, and the periphery of the part of the threaded rod 624 of the second bolt 62 located in the second outer fastening hole 426 is distanced form the inner wall of the second outer fastening hole 426 by an interval C2. As a result, as long as the second bolts 62 are loosened, the position of the outer die 42 can be horizontally fine adjusted. Besides, for the embodiments as shown in FIG. 12 and FIG. 13, the outer die 42 is prevented from having too large span, but the outer surface 422 of the outer die 42 can still have sufficient area for being provided with the aforementioned accommodating trough 422a for accommodating a component (not shown). For example, the accommodating trough 422a as shown in FIG. 13 is adapted for accommodating the component disposed on the bottom surface of the space transformer located above the upper die unit 40A.

It is to be mentioned that the fastening manner of the bolts as shown in FIG. 12 and FIG. 13 is also applicable in the aforementioned first preferred embodiment, and the fastening manner of the bolts in the first preferred embodiment is also applicable in the configurations without the hat-shaped structure as shown in FIG. 12 and FIG. 13. In other words, the first inner fastening hole 417 shown in FIG. 12 and FIG. 13 may be modified into the counterbore as shown in FIG. 4 to include large and small radius portions 417a and 417b, and the large radius portion 417a and the first outer fastening hole 425 collectively accommodate the bolt head 612 of the first bolt 61, or the bolt head 612 of the first bolt 61 may be even completely located in the large radius portion 417a of the first inner fastening hole 417. In such condition, the bolt head 612 of the first bolt 61 is distanced from the inner wall of the large radius portion 417a of the first inner fastening hole 417 by an interval. Likewise, the second outer fastening hole 426 shown in FIG. 12 and FIG. 13 may be modified into the counterbore as shown in FIG. 3 to include large and small radius portions 427 and 428 and the large radius portion 427 accommodates the bolt head 622 of the second bolt 62, so that the parts of the bolt head 622 and the threaded rod 624 of the second bolt 62 located in the second outer fastening hole 426 are respectively distanced from the inner walls of the large and small radius portions 427 and 428 of the second outer fastening hole 426 by an interval.

Figure 14:
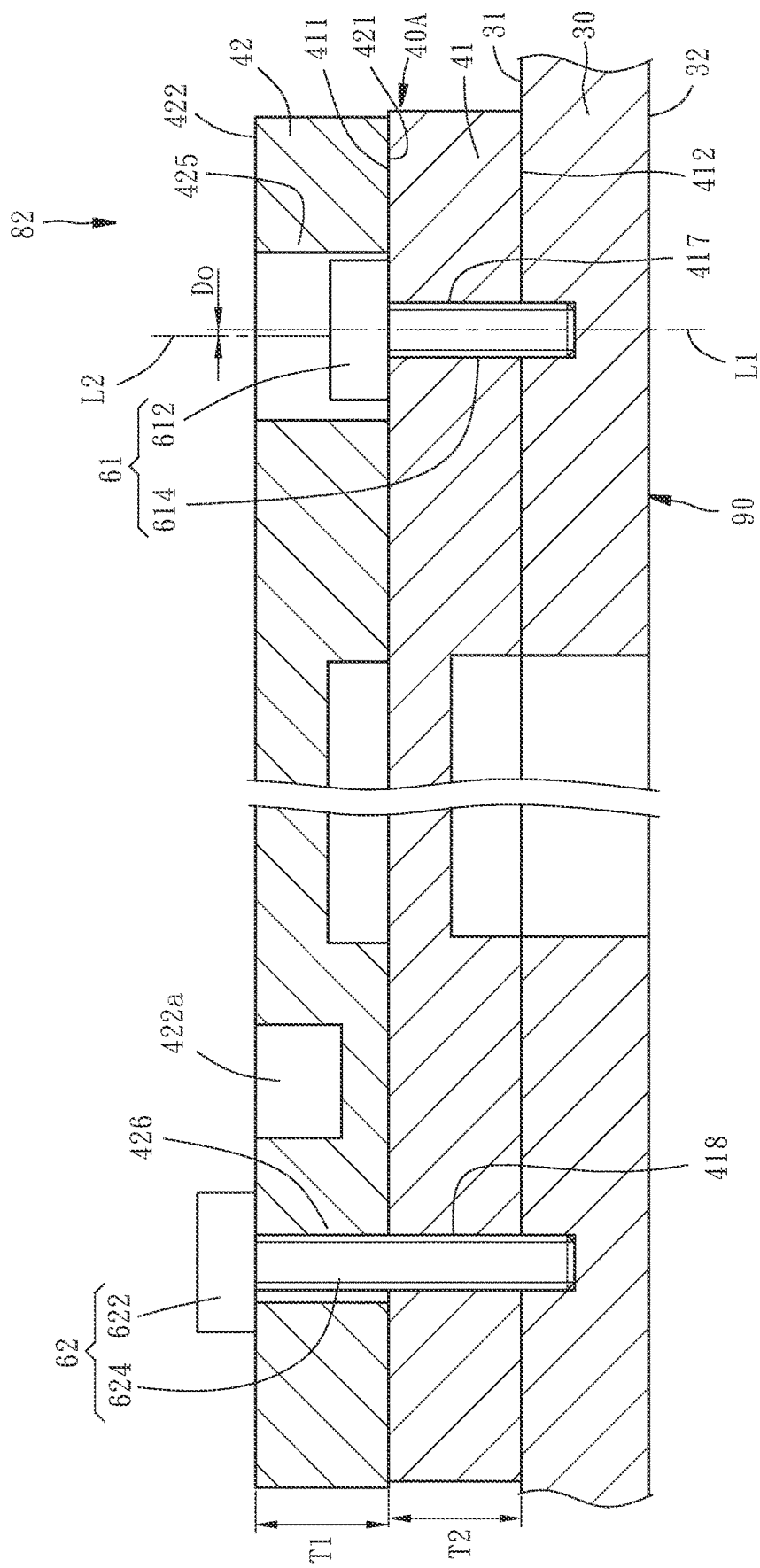
FIG. 14 is similar to FIG. 13 but showing that the upper die is horizontally adjusted.

In practical applications, the die sets 81 and 82 as shown in FIG. 12 and FIG. 13 are also provided with such probe installation positioning holes 36 and 43 and inner and outer probe holes 416 and 424 as shown in FIG. 2 and FIG. 4 for the installation of the probes 70. Therefore, in the first, second or third preferred embodiment, the outer surface 422 of the outer die 42 is defined with a probe region A as shown in FIG. 6 and FIG. 7 for a plurality of probes 70 to be inserted in the probe region, i.e. the region of the outer die 42 provided with the outer probe holes 424. As described above, the outer probe holes are not shown in FIG. 6 and FIG. 7, so the probe region A is schematically shown by imaginary lines. The probe region A is located between the first and second outer fastening holes 425 and 426, and the probe region A is located correspondingly to the aforementioned probe accommodating space 22. If the outer die 42 of the adjustable die unit 40A or 40B has been horizontally fine adjusted, it can be observed by the user in the above-described manner as shown in FIG. 11. In other words, by the through holes of the inner and outer dies 41 and 42 communicating with each other, the user can observe through the through hole of the outer die 42, such as the outer probe hole 424, whether there is a shadow produced by the partial inner wall of the through hole of the inner die 41, such as the inner probe hole 416. If there is such condition similar to that shown in FIG. 11, it means the two through holes are not coaxial, so it can be known that the outer die 42 has been horizontally fine adjusted. Besides, the user can affirm if the outer die 42 of the adjustable die unit 40A or 40B has been horizontally fine adjusted by the relative position between the first bolt 61 and the first outer fastening hole 425. Specifically speaking, the first bolt 61 and the first outer fastening hole 425 are defined with central axes L1 and L2 respectively. If the outer die 42 has not been horizontally fine adjusted, the central axes L1 and L2 are colinear as shown in FIG. 12 and FIG. 13. If the outer die 42 has been horizontally fine adjusted, an offset Do will exist between the central axis L1 and the central axis L2, as shown in FIG. 14. If the user observes that the central axis L1 of the first bolt 61 is offset from the central axis L2 of the first outer fastening hole 425, it can be known that the outer die 42 has been horizontally fine adjusted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe head, which is defined with a horizontal axis and a vertical axis perpendicular to the horizontal axis, the probe head comprising:
   a middle die having a top surface, a bottom surface, and an accommodating hole penetrating through the top surface and the bottom surface;
   an upper die unit and a lower die unit disposed on the top surface and the bottom surface of the middle die respectively, at least one of the upper die unit and the lower die unit being an adjustable die unit, the adjustable die unit comprising an inner die and an outer die, which are detachably fastened to the middle die and detachably fastened to each other, the outer die having an inner surface, an outer surface, and an installation recess recessed from the inner surface, the inner die having an outer connecting surface connected with the inner surface of the outer die, an inner connecting surface connected with the middle die, and a probe installation section, the probe installation section having a protruding portion protruding from the outer connecting surface and located in the installation recess of the outer die, and a recessed portion recessed from the inner connecting surface and located correspondingly to the protruding portion, a horizontal distance being provided between the protruding portion and at least one inner side surface of the installation recess along the horizontal axis, the recessed portion and the accommodating hole of the middle die collectively forming a probe accommodating space; and a plurality of probes each having a head portion inserted through the lower die unit, a tail portion inserted through the upper die unit, and a body portion located in the probe accommodating space, the head portion and the tail portion of each of the probes being offset from each other along the horizontal axis to make the body portion buckled in shape.

2. The probe head as claimed in claim 1, wherein the horizontal distance is larger than or equal to 0.05 millimeters and smaller than or equal to 2 millimeters.

3. The probe head as claimed in claim 1, wherein a vertical distance is provided between the protruding portion of the inner die and an inner bottom surface of the installation recess of the outer die along the vertical axis.

4. The probe head as claimed in claim 3, wherein the vertical distance is larger than or equal to 0 millimeter and smaller than or equal to 2 millimeters.

5. The probe head as claimed in claim 1, wherein the outer die has at least one first outer fastening hole and at least one second outer fastening hole, which penetrate through the inner surface and the outer surface of the outer die and located around the installation recess; the inner die has at least one first inner fastening hole communicating with the first outer fastening hole, and at least one second inner fastening hole communicating with the second outer fastening hole; the first inner fastening hole and the second inner fastening hole penetrate through the inner connecting surface and the outer connecting surface of the inner die and located around the probe installation section; the probe head further comprises at least one first bolt inserted in the first inner fastening hole through the first outer fastening hole, and at least one second bolt inserted in the second outer fastening hole and the second inner fastening hole in a way that a position of the outer die is fine adjustable along the horizontal axis; the first bolt is detachably fixed to the middle die to fasten the inner die to the middle die; the second bolt is detachably fixed to the middle die to fasten the outer die to the inner die and the middle die.

6. The probe head as claimed in claim 5, wherein the inner die is defined with an inner wall thickness as a distance between an outer peripheral surface of the protruding portion and an inner peripheral surface of the recessed portion along the horizontal axis; each of the first bolt and the second bolt comprises a threaded rod partially disposed in the middle die; a fastening distance is provided between each of the threaded rods and the probe accommodating space along the horizontal axis; the fastening distance is larger than a sum of the horizontal distance and the inner wall thickness of the inner die.

7. The probe head as claimed in claim 5, wherein the second outer fastening hole is a counterbore comprising a large radius portion and a small radius portion; the second bolt comprises a bolt head located in the large radius portion of the second outer fastening hole; a diameter of the large radius portion is larger than a diameter of the bolt head.

8. The probe head as claimed in claim 5, wherein the second bolt comprises a threaded rod disposed in the outer die, the inner die and the middle die; a diameter of a part of the second outer fastening hole for the threaded rod of the second bolt to be inserted therein is larger than a diameter of the threaded rod.

9. The probe head as claimed in claim 1, wherein the outer die is defined with an outer wall thickness as a distance between an outer peripheral surface of the outer die and the inner side surface of the installation recess along the horizontal axis; the inner die is defined with an inner wall thickness as a distance between an outer peripheral surface of the protruding portion and an inner peripheral surface of the recessed portion along the horizontal axis; the inner wall thickness is larger than 0.1 millimeters; the outer wall thickness is larger than the inner wall thickness.

10. A probe head adjusting method, which is adapted for adjusting the probe head as claimed in claim 5, the probe head adjusting method comprising the steps of:
    loosening the second bolt disposed in the adjustable die unit;
    adjusting the position of the outer die of the adjustable die unit along the horizontal axis; and
    tightening the second bolt disposed in the adjustable die unit.

11. A die set comprising:
    a fixed unit;
    an adjustable die unit comprising an inner die and an outer die, the outer die having an inner surface, an outer surface, and at least one first outer fastening hole and at least one second outer fastening hole, which penetrate through the inner surface and the outer surface, the inner die having an outer connecting surface connected with the inner surface of the outer die, an inner connecting surface connected with the fixed unit, at least one first inner fastening hole communicating with the first outer fastening hole, and at least one second inner fastening hole communicating with the second outer fastening hole, the first inner fastening hole and the second inner fastening hole penetrating through the inner connecting surface and the outer connecting surface;
    at least one first bolt inserted in the first inner fastening hole through the first outer fastening hole and detachably fixed to the fixed unit to fasten the inner die to the fixed unit; and
    at least one second bolt inserted in the second outer fastening hole and the second inner fastening hole and detachably fixed to the fixed unit to fasten the outer die to the inner die and the fixed unit;
    wherein each of the first bolt and the second bolt comprises a bolt head and a threaded rod; the bolt head of the first bolt is disposed in at least one of the first outer fastening hole and the first inner fastening hole and distanced from an inner wall of the at least one of the first outer fastening hole and the first inner fastening hole by an interval; each part of the second bolt, which is located in the second outer fastening hole, is distanced from an inner wall of the second outer fastening hole by an interval.

12. The die set as claimed in claim 11, wherein each of the inner die and the outer die is defined with a thickness at an outer periphery of the die set; the thickness of the outer die is larger than or equal to the thickness of the inner die.

13. The die set as claimed in claim 11, wherein the outer surface of the outer die is provided with an accommodating trough for accommodating a component.

14. The die set as claimed in claim 11, wherein each of the inner die and the outer die has a through hole for one of a probe and a positioning pin to be inserted through the through hole; the through hole of the inner die and the through hole of the outer die communicate with each other and non-coaxial with each other.

15. The die set as claimed in claim 11, wherein each of the first bolt and the first outer fastening hole is defined with a central axis; the central axis of the first bolt is offset from the central axis of the first outer fastening hole.

16. The die set as claimed in claim 11, wherein the fixed unit comprises a middle die; the middle die has a top surface, a bottom surface, and an accommodating hole penetrating through the top surface and the bottom surface; the outer die has an installation recess recessed from the inner surface; the inner die has a probe installation section; the probe installation section has a protruding portion protruding from the outer connecting surface and located in the installation recess of the outer die, and a recessed portion recessed from the inner connecting surface and located correspondingly to the protruding portion; a horizontal distance is provided between the protruding portion and at least one inner side surface of the installation recess; the recessed portion and the accommodating hole of the middle die collectively form a probe accommodating space.

17. The die set as claimed in claim 16, wherein the outer surface of the outer die is defined with a probe region for a plurality of probes to be inserted in the probe region; the probe region is located correspondingly to the probe accommodating space.

18. The die set as claimed in claim 11, wherein the outer surface of the outer die is defined with a probe region for a plurality of probes to be inserted in the probe region; the probe region is located between the at least one first outer fastening hole and the at least one second outer fastening hole.

\* \* \* \* \*